United States Patent
Sheng et al.

(10) Patent No.: US 9,847,378 B2
(45) Date of Patent: Dec. 19, 2017

(54) RESISTIVE MEMORY DEVICES WITH A MULTI-COMPONENT ELECTRODE

(71) Applicant: Hewlett Packard Enterprise Development LP, Houston, TX (US)

(72) Inventors: Xia Sheng, Palo Alto, CA (US); Yoocharn Jeon, Palo Alto, CA (US); Jianhua Yang, Palo Alto, CA (US); Hans S. Cho, Palo Alto, CA (US); Richard H. Henze, San Carlos, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/306,125

(22) PCT Filed: Apr. 30, 2014

(86) PCT No.: PCT/US2014/036195
§ 371 (c)(1),
(2) Date: Oct. 24, 2016

(87) PCT Pub. No.: WO2015/167540
PCT Pub. Date: Nov. 5, 2015

(65) Prior Publication Data
US 2017/0053968 A1 Feb. 23, 2017

(51) Int. Cl.
*H01L 47/00* (2006.01)
*H01L 27/24* (2006.01)
(Continued)

(52) U.S. Cl.
CPC ...... *H01L 27/2463* (2013.01); *G11C 13/0002* (2013.01); *G11C 13/003* (2013.01);
(Continued)

(58) Field of Classification Search
CPC ............ H01L 27/2463; H01L 27/2481; H01L 27/249; H01L 45/06; H01L 45/16;
(Continued)

(56) References Cited

U.S. PATENT DOCUMENTS

| 6,682,772 | B1 | 1/2004 | Fox et al. |
| 7,960,216 | B2 | 6/2011 | Phatak |
| 8,563,962 | B2 | 10/2013 | Arita et al. |
| 8,581,224 | B2 | 11/2013 | Sandhu et al. |
| 2004/0005724 | A1 | 1/2004 | Lee et al. |
| 2004/0101979 | A1 | 5/2004 | Hsu et al. |
| 2005/0128840 | A1 | 6/2005 | Rinerson |
| 2009/0095985 | A1 | 4/2009 | Lee et al. |
| 2013/0023105 | A1* | 1/2013 | Pramanik ............ H01L 21/0332 438/381 |
| 2013/0084700 | A1 | 4/2013 | Swerts et al. |

(Continued)

OTHER PUBLICATIONS

Frohlich, K. et al., Atomic Layer Deposition of Thin Oxide Films for Resistive Switching, May 17, 2013, 1 Pg.
(Continued)

*Primary Examiner* — Brook Kebede
(74) *Attorney, Agent, or Firm* — Dierker & Associates, P.C.

(57) ABSTRACT

A resistive memory device includes a conductor and a resistive memory stack in contact with the conductor. The resistive memory stack includes a multi-component electrode and a switching region. The multi-component electrode includes a base electrode having a surface, and an inert material electrode on the base electrode surface in a form of i) a thin layer, or ii) discontinuous nano-islands. A switching region is in contact with the conductor and with the inert material electrode when the inert material electrode is in the form of the thin layer; or the switching region is in contact with the conductor, with the inert material electrode, and with an oxidized portion of the base electrode when the inert material electrode is in the form of the discontinuous nano-islands.

15 Claims, 4 Drawing Sheets

(51) Int. Cl.
*G11C 13/00* (2006.01)
*H01L 45/00* (2006.01)

(52) U.S. Cl.
CPC ........ *H01L 27/249* (2013.01); *H01L 27/2481* (2013.01); *H01L 45/08* (2013.01); *H01L 45/1233* (2013.01); *H01L 45/1253* (2013.01); *H01L 45/1273* (2013.01); *H01L 45/145* (2013.01); *H01L 45/146* (2013.01); *H01L 45/16* (2013.01); *H01L 45/1616* (2013.01); *H01L 45/1675* (2013.01); *H01L 45/1683* (2013.01); *G11C 2213/52* (2013.01); *G11C 2213/71* (2013.01); *G11C 2213/73* (2013.01)

(58) Field of Classification Search
CPC ............... H01L 45/085; H01L 45/1616; H01L 45/1246; H01L 45/1253
USPC .................. 257/4, 5, E21.003; 438/381, 382
See application file for complete search history.

(56) References Cited

U.S. PATENT DOCUMENTS

2013/0134383 A1\* 5/2013 Hwang ................... H01L 45/16
257/5

OTHER PUBLICATIONS

International Searching Authority, The International Search Report and the Written Opinion, PCT/US2014/036195, dated Apr. 13, 2015, 11 Pages.

\* cited by examiner

“RESISTIVE MEMORY DEVICES WITH A MULTI-COMPONENT ELECTRODE”

BACKGROUND

Resistive memory elements are programmable to different resistive states by the application of programming energy (e.g., a voltage or current pulse). After a resistive memory element is programmed, the state of the element is readable and remains stable over a specified time period. Resistive memory elements may be configured into large arrays to form resistive memory devices. Resistive memory devices may be used in a variety of applications, such as non-volatile solid state memory, programmable logic, signal processing, control systems, pattern recognition devices, etc. Some examples of resistive memory devices include memristors, phase change memory, and spin-transfer torque. In particular, a single memristor is a passive two-terminal element that maintains a functional relationship between the time integral of current charge) and the time integral of voltage. The resistance of the memristor depends on the material, thickness, and the state the device. The resistance of each state also depends on the magnitude and polarity of the voltage applied thereto, and on the length of time that voltage has been applied.

BRIEF DESCRIPTION OF THE DRAWINGS

Features and advantages of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

DETAILED DESCRIPTION

Figure 1A:
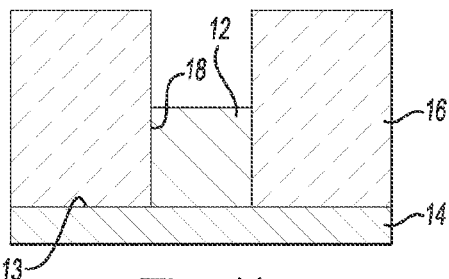
FIGS. 1A through 1D are cross-sectional views depicting an example of a method for making an example of a resistive memory device.

Memristor and other resistive memory devices/cells include a switching region sandwiched between two conductors. These devices/cells may be fabricated in a crossbar configuration or in a non-crossbar configuration. In one example of a crossbar configuration, the conductors are positioned in row(s) and column(s) as conductive elements to electrically access/address a memristive switching region located at an intersection of the crossing conductors (see, e.g., FIG. 8). In another example of a crossbar configuration, the switching regions are sandwiched between a set of parallel horizontal conductors and an intersecting, set of vertical conductors, where the switching regions are on a plane that is nominally perpendicular to a substrate surface (see, e.g., FIG. 9). In a non-crossbar configuration, each device/cell may be integrated until a corresponding transistor, which is capable of individually accessing/addressing each device/cell. An example of the non-crossbar configuration is a 1-transistor 1 or n-memristor cell (i.e., 1T1R or 1TnR). The non-crossbar configuration may include stacked/planar layers, or may include some components that are horizontally oriented and other components that are vertically oriented.

In these devices/cells, the switching region may include an oxygen-rich layer and an oxygen vacancy/ion source/ layer that are stacked or otherwise positioned between the two conductors. In some examples, the layers are parallel to one another and to the conductors. In these devices, current flows in a direction normal to the stacked layers. Electrical switching arises from the coupled motion of electrons and an ionic species (e.g., oxygen vacancies or ions) within the switching region between the two conductors. More particularly, the ionic species are caused to move through the switching region to create localized changes in conductivity via modulation of a conductive filament and/or tunnel barrier between the two conductors, which results in a low resistance "ON" state, a high resistance "OFF" state, or intermediate states. The motion of the ionic species may, in some instances, also lead to interactions with the adjacent conductor(s), which can contribute to device/cell degradation.

In the examples disclosed herein multi-layer component electrode(s) is/are used in place of one or both of the conductors, or the multi-layer component electrode is used as another electrode in addition to the conductors. The multi-layer component electrode incorporates an inert material electrode, in the form of a thin layer or discontinuous nano-islands, positioned on another base electrode. As used herein, the phrase "inert material electrode" means a conductive metal or metal compound that is inert to oxidation. Moreover, the multi-component electrode (whether used as, or in addition to, the conductor) is configured such that the inert material electrode is in direct contact with the switching region, and the base electrode may or may not be in direct contact with the switching region. In some instances, the inert material electrode is positioned between the base electrode and the switching region, and thus the base electrode does not contact the switching region. In other instances, the inert material electrode and an oxidized portion of the base electrode directly contact the switching region. In these other instances, conduction through the multi-component electrode may preferentially occur through the conductive portions of the base electrode and the inert material electrode, when there may be increased resistance through the oxidized portion of the base electrode. The various configurations of the multi-component electrode may provide the device with more stable electrical behavior. In addition, the inert material electrode advantageously limits the base electrode or localized regions of the base electrode from scavenging oxygen from the switching region and becoming oxidized or otherwise negatively impacting the reversibility and endurance of the switching operation. The inert material electrode also limits the switching region at the base electrode/switching region interface from reducing to form additional oxygen vacancies/ions. At least limiting or preventing the oxidation of the base electrode is believed to reduce degradation of the electrical switching and increase in device endurance.

Referring now to FIGS. 1A through 1D, an example of a method for making an example of a resistive memory device (e.g., cell) 10 (see FIG. 1D) is schematically depicted. As shown in FIG. 1A, in this example of the method a base electrode 12 and an interlayer dielectric 16 are formed on a first conductor 14.

The conductor 14 may be formed of any suitable conductive material used as a conductor in integrated circuit fabrication (e.g., tungsten (W), aluminum (Al), copper (Cu), titanium (Ti), tantalum (Ta), titanium nitride (TiN), tantalum nitride (TaN), etc.), and may have any suitable thickness (e.g., ranging from about 5 nm to about 1000 nm). The conductor 14 as we as the second conductor 30 discussed below and shown in FIG. 1D) may be a single layer having a singe-component composition, a single layer with a multi-component composition, or a multi-layered structure with different materials in each of the layers.

The conductor 14 may be fabricated using any suitable technique such as lithography (e.g., photolithography, electron beam lithography, imprint lithography, etc.), thermal or e-beam evaporation, sputtering, atomic layer deposition (ALD), or the like. Although the conductor 14 is shown with a rectangular cross-section, it is to be understood that the conductor 14 may also have a trapezoidal, a circular, an elliptical, or another more complex cross-section. The conductor 14 may also have many different widths or diameters and aspect ratios or eccentricities.

In an example, the interlayer dielectric 16 is formed as a planar film with respect to a contact surface 13 of the conductor 14. Suitable deposition techniques for the interlayer dielectric 16 include conventional physical and chemical techniques, including evaporation from a heated source, such as a filament or a Knudsen cell, electron beam (i.e., e-beam) evaporation from a crucible, sputtering from a target, other forms of evaporation, chemical vapor deposition (CVD), physical vapor deposition (PVD), molecular beam deposition, atomic layer deposition, pulse laser deposition, or various other forms of chemical vapor or beam growth from reactive precursors. Appropriate deposition or growth conditions, such as speed and temperature, may be selected to achieve the desirable chemical composition and local atomic structure desired for the interlayer dielectric 16.

Examples of suitable materials for the interlayer dielectric 16 include silicon dioxide ($SiO_2$), silicon nitride ($Si_3N_4$), spin-on-glass, or aluminum oxide ($Al_2O_3$).

The thickness of the interlayer dielectric 16 may range anywhere from 5 nm to about 1000 nm. In an example, the thickness of the interlayer dielectric is greater than or equivalent to the thickness of the stack 32 to be formed (see FIG. 1C).

It is to be understood that if the conductor 14 is formed on another layer (e.g., a substrate or a substrate and an insulating layer), the interlayer dielectric 16 may be formed directly on the surface of the substrate or insulating layer, and may also contact one or more exposed sides of the conductor 14 as well. As such, if multiple conductors 14 were formed on a substrate, the interlayer dielectric 16 may fill any gap between the conductors 14 and electrically isolate the conductors 14 from one another. It is to be understood that the multiple conductors 14 are electrically addressable, e.g., through an exposed end.

For each multi-component electrode 22 (see FIG. 1B) to be formed on the conductor 14, a corresponding trench 18 is formed in the interlayer dielectric 16. FIG. 15 illustrates a single trench 18, which is suitable for a two-terminal memristor. It is to be understood that additional trenches 18 may be formed, depending, in part, upon the conductor 14 dimensions, a dimensions for the stack 32, etc.

The trench(es) 18 may be formed by patterning the interlayer dielectric 16 so that a via having a shape is formed therein. The shape of the trench 18 may be a cylinder, a rectangular prism, a cube, or another geometric shape. In an example, the geometric shape of the trench 18 has side was that are substantially perpendicular to the contact surface 13 of the conductor 14. In this example, the trench 18 has a rectangular prism shape (as such, the stack 32 also has a rectangular prism shape, which is shown in hidden line in FIG. 2).

It is to be understood that the patterning of the trench 18 is performed such that the contact surface 13 of the conductor 14 is exposed. As such, the bottom of the trench 18 is the contact surface 13. Several techniques may be used to pattern the trench 18, including anisotropic reactive on etching, reactive ion etching, ion beam milling, focused ion beam milling (FIB), a liftoff process, or any other wet or dry chemical etching method. The bottom conductor 14 may act as an etch stop. In an example, anisotropic reactive ion etching may be particularity desirable because it allows for the selective removal of a portion of the interlayer dielectric 16. It is to be understood that patterning may be performed with or without a mask, depending upon the technique used.

As shown in FIG. 1A, the base electrode 12 is formed in at least a portion of the trench 18. The base electrode 12 may be any conductive material including those that may have a tendency to oxidize. Examples of the base electrode 12 include titanium nitride (TiN), tantalum nitride (TaN), tungsten (W), aluminum (Al), and copper (Cu).

The base electrode 12 may be formed by electro-chemical deposition or electroless deposition. These are growth processes that form the base electrode 12 in the trench 18. In the example shown in FIG. 1A, the base electrode 12 fills a portion of the trench 18, but does not fill the entire trench 18. In other examples, it may be desirable to form the base electrode 12 so that it fills the trench 18.

Figure 1B:
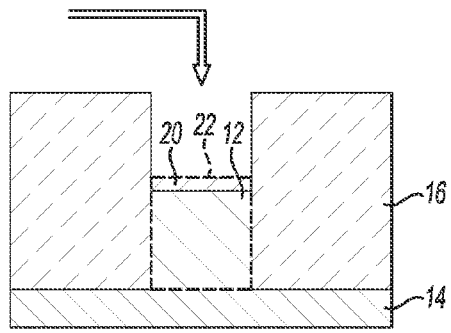

After the base electrode 12 is formed, the method includes forming inert material electrode 20. As shown in FIG. 1B, in this example of the method, the inert material electrode 20 is a thin layer formed directly on the exposed surface of the base electrode 12. The thin layer has a thickness of 10 nm or less. In an example, the thin layer has a thickness of 5 nm or less.

The inert material electrode 20 may be formed of any conductive metal or metal compound that is inert to oxidation. The conductivity allows the inert material electrode 20 to participate, as a catalyst, in switching of the final device/cell 10. However, the inert material's resistance to oxidation aids in keeping an oxide from forming at the interface between the inert material electrode 20 and a metal oxide layer 26 of a switching region 24 subsequently thereon (note that both 26 and 24 are shown and described further in FIG. 1C). Examples of suitable materials for the inert material electrode 20 include noble metals, such as platinum and gold, special metals, such as iridium and ruthenium, metal carbide, such as titanium carbide, tantalum carbide, aluminum carbide, and tungsten carbide, metal boride, such as titanium boride, tantalum boride, aluminum boride, and tungsten boride, and combinations thereof.

The inert material electrode 20 may be formed by electroplating or electroless plating the inert material from solution. Electroplating or electroless plating provides selective attachment of the inert material to the surface of the base electrode 12. During electroplating or electroless plating, the base electrode 12 and the interlayer dielectric 16 are exposed to a solution including the inert material in the form of dissolved cations. For electroplating, the solution may include $H_2PtCl_6$ in HCl. For electro less plating, the solution may include $Na_2Pt(OH)_6$ in NaOH, $(NH_3)_2Pt(NO_2)_2$ in $NaNO_2$, or $K_2Pt((NO_2)_4$ in $NH_4OH$ with the addition of $N_2H_2$. In electroplating, electrical current is used to reduce the dissolved inert material cations so that they form a coherent, continuous metal coating on the exposed surface of the base electrode 12. The electrical current is not used in electroless plating. In these examples, the coherent, continuous metal coating is the inert material electrode 20.

Figure 1C:
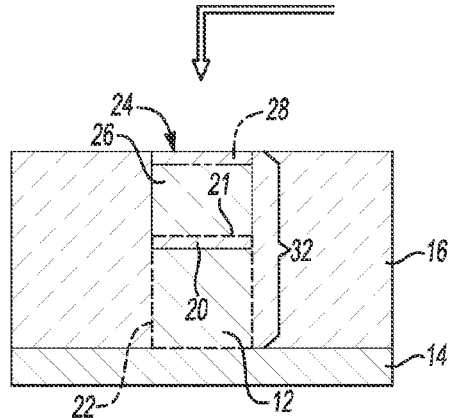

Together, the base electrode 12 and the inert material electrode 20 form the multi-component electrode 22 (which is outlined in dashed line in FIGS. 1B and 1C).

As shown in FIG. 1C, the switching region 24 is then formed on the inert material electrode 20. In the example shown in FIG. 1C, the switching region 24 is also formed in the trench 18 so that it is surrounded by the interlayer dielectric 16. In another example (not shown), the base electrode 12 may fill the trench 18, and the switching region 24 may be formed on exposed portions of the base electrode 12 and the interlayer dielectric 16. In an example, the switching region 24 is a metal oxide layer 26 including an oxygen-rich portion O and an oxygen-deficient portion OD (shown in FIG. 1D). In another example, the switching region 24 includes the metal oxide layer 26 (having the oxygen-rich portion O and the oxygen-deficient portion OD) and a metal layer 28 formed in contact with the metal oxide layer 26.

The oxygen-rich portion O and the oxygen-deficient portion OD are not shown in FIG. 1C, in part because they may not be present after the initial formation of the metal oxide layer 26. Rather, the oxygen-rich portion O and the oxygen-deficient portion OD may be introduced into the switching region 24 after the device 10 is formed. The formation of the oxygen-rich portion O and the oxygen-deficient portion OD will be discussed further below in reference to FIG. 1D.

To initially form the switching region 24, the metal oxide layer 26 may be deposited directly on the exposed surface 21 of the inert material electrode 20. The metal oxide used may depend upon the desired material for the switching region 24. As examples, the metal oxide may be titanium dioxide ($TiO_2$), tantalum pentoxide ($Ta_2O_5$), nickel (II) oxide ($NiO_2$), zirconium oxide ($ZrO_2$), or hafnium (IV) oxide ($HfO_2$).

Deposition of the metal oxide layer 26 may be accomplished by growing the material on the surface 21 of the inert material electrode 20. Examples of suitable growth techniques include plasma enhanced chemical vapor deposition (PECVD), sputtering, and atomic layer deposition (ALD). If the deposition is performed such that the metal oxide layer 26 extends onto the surface of the interlayer dielectric 16, planarization and etch back may be performed so that a planar surface is formed by the metal oxide layer 26 and the interlayer dielectric 16. The deposition may also be stopped so that the metal oxide does not fill the trench 18. This may be desirable, for example, when the metal layer 28 is to be formed.

In some instances, formation of the switching region 24 also involves forming the metal layer 28 on the metal oxide layer 26. The metal layer 28 may not be desirable if the oxygen-deficient portion OD is sufficiently oxygen deficient. Otherwise, the metal layer 28 may be desirable to provide a source of metal ions that electrostatically drift (in response to heat generated during high current switching) to the metal oxide layer 26 at the interface to form additional oxygen vacancies and/or ions in the oxygen-deficient portion OD that can participate in switching. The metal layer 28 may also act as a protection layer for the metal oxide layer 26.

The material used to form the metal layer 28 depends upon the metal oxide 26 that is used. The following table provides examples of suitable combinations of the metal oxide layer 26 and the metal layer 28.

| METAL OXIDE LAYER/METAL LAYER COMBINATIONS | |
|---|---|
| metal oxide layer | metal layer |
| titanium dioxide ($TiO_2$) | titanium (Ti) |
| tantalum pentoxide ($Ta_2O_5$) | tantalum (Ta) |
| nickel (II) oxide ($NiO_2$) | nickel (Ni) |
| zirconium oxide ($ZrO_2$) | zirconium (Zr) |
| hafnium (IV) oxide ($HfO_2$) | hafnium (Hf) |

The metal layer 20 may be deposited using any selective deposition process, such as evaporation, electroplating, sputtering, PECVD, ALD, etc.

Together, the multi-component electrode 22 and the switching region 24 form the resistive memory stack 32.

Figure 1D:
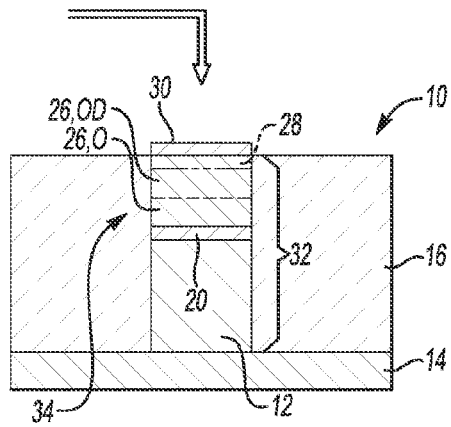
Figure 2:
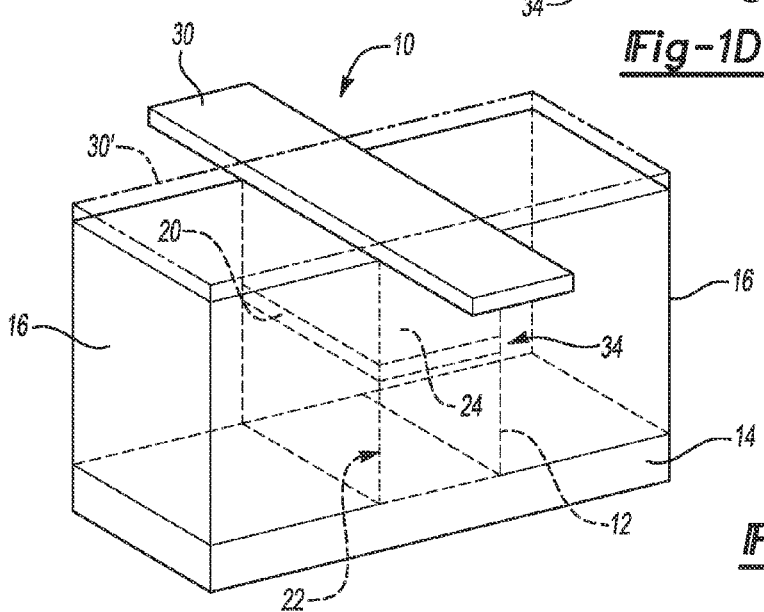
FIG. 2 is a perspective view of the example resistive memory device formed from the method shown in FIGS. 1A through 1D.

After the resistive memory stack 32 is formed, the method further includes forming the second conductor 30 on the switching region 24 of the stack 32. One example of the second conductor 30 is depicted in FIG. 1D (cross-sectional view) and two examples of the second conductor 30, 30' are shown in FIG. 2 (perspective view). Either conductor 30 or conductor 30' may be used.

The conductor 30 or 30' may be formed so that it is at least in contact with the switching region 24. The interlayer dielectric 18 may also support the conductor 30, 30'. The conductor 30, 30' may be formed of any of the materials and by any of the techniques previously discussed for the conductor 14.

It is to be understood that when the metal layer 28 is not included in the switching region 24, the second conductor 30, 30' will be in direct contact with the metal oxide layer 26. It is to be further understood that when the metal layer 28 is included, the second conductor 30, 30' will be in direct contact with the metal layer 28.

As depicted in FIG. 2, the conductor 30 is positioned at some non-zero angle with respect to the conductor 14. This non-zero angle positioning prevents shorting of the resulting device(s)/cell(s) 10, for example, when multiple devices/cells 10 are formed on a single conductor 14 in a crossbar configuration.

When a plurality of multi-component electrodes 22 and switching regions 24 are formed on a single conductor 14, it is to be understood that respective conductors 30 are formed i) to be in electrical contact with a single one of the switching regions 24 and ii) to be electrically isolated from one another. This would form a crossbar configuration.

As shown in phantom in FIG. 2, the conductor 30 may be positioned on the switching region 24 (and interlayer dielectric 16) so that it is at the same angle or position as the conductor 14. In this configuration, the conductors 14, 30 are not crossbars. This type of device/cell may be integrated with a single transistor. In an example, the single transistor may be a high-performance single crystal silicon transistor or some other suitable transistor.

In the non-crossbar configuration, the device/cell 10 includes the multi-component electrode 22 at one or both terminals of the device/cell 10. In an example, a transistor source/drain terminal may function as one of the conductors 14 or 30. In another example, if the 1-transistor 1-memristor (1T1R) arrangement is used, the conductor 14 or 30' may be a metal conductive trace on a layer connected to the transistor terminal through a via. For example, the memristive switching region 24 may be positioned at a different layer of the circuit structure, and may be accessed by means of vias and metal (i.e., conductors).

With the addition of conductor 30, 30, the resistive memory device/cell 10 is formed. The device 10 has a single junction 34 (with one resistive memory stack 32) located between (e.g., at the intersection of) the conductors 14, 30. The junction 34 is individually addressable by the respective crossing conductors 14, 30 or a switching transistor operatively connected to and/or including the conductor(s) 14, 30'.

When the device 10 is first fabricated, the entire switching region 24 may be either nonconductive or in an initial high resistive state. As such, a forming process or an initial switching process may be utilized to form conductive channel(s) in the metal oxide layer 26 between the inert material electrode 20 of the multi-component electrode 22 and the conductor 30, 30'. The conductive channel(s) within the metal oxide layer 26 become the dominant regions of current flow between the conductors 14, 30 or 30'. The remainder of the current path is made up of the multi-component electrode 22, in which the inert material electrode 20 is in direct contact with the conductive channel(s) and the base electrode is in direct contact with the inert material electrode 20.

An example of the forming process is electroforming, which includes applying a sufficiently high (threshold) voltage across the conductors 14, 30 for a sufficient length of time to produce a significant permanent change of electronic conductivity through the metal oxide layer 26. The threshold voltage and the length of time required for the forming process may depend upon the layers 26 or 26, 28 and type of material(s) used for the switching region 24, the conductors 14, 30, and the device geometry.

During the electroforming process, oxygen vacancies are created in and ions are moved into or out of the metal oxide layer 26. During the process, oxygen ions are removed from the metal oxide layer 26 and/or metal ions are pushed into the metal oxide layer 26. This results in the formation of the conductive oxygen-deficient portion OD of the metal oxide layer 26. When oxygen ions are removed from the metal oxide layer 26 while it maintains the crystalline lattice intact, the spaces the oxygen ions formerly occupied are called oxygen vacancies. As an example, the oxygen-deficient portion OD is a sub-oxide, such as $TiO_{2-x}$, $Ta_2O_{5-x}$, $NiO_{2-x}$, $ZrO_{2-x}$, or $HfO_{2-x}$. The other portion of the metal oxide layer 26 remains rich in oxygen, and thus is referred to as the oxygen-rich portion O. Under an electric field applied to the conductor 14, the oxygen ions are removed from (i.e., oxygen vacancies are created in or metal ions drift toward the conductor 14. This forms localized conductive channel(s) of the sub-oxide in the oxygen-rich portion O. The sub-oxide is an oxygen-deficient, conductive filament. Examples of the sub-oxide that form the conductive channel(s) include $TiO_{2-x}$, $Ta_2O_{5-x}$, $NiO_{2-x}$, $ZrO_{2-x}$, or $HfO_{2-x}$, depending upon the composition of the metal oxide layer 26. In some cases, the as fabricated device will undergo electroforming at voltage and/or current levels equal or similar to those levels during nor switching operation.

Alternatively to electroforming, a thermal anneal may be performed during or after device 10 fabrication. The thermally annealing process may induce chemical reactions or diffusion of metal and oxygen atoms between the layers 26, 28 to the degree that the metal oxide layer 26 becomes metallic in composition, and thus becomes electrically conducting, prior to any applied electrical stress. This is often referred to as an "initially ON state" device 10, which may be desirable because it goes not require high forming voltages. In this case, the application of a negative pulse can switch the device to the "OFF," or high resistance, state.

It is to be understood that the device 10 may also be a forming-free device (e.g., no electroforming or thermal annealing is used). The forming-free device may be achieved by using a thinner metal oxide layer 26, by including preformed filaments or filament-like features (conductive nano protrusions, conductive nano-particles) in the metal oxide layer 26, or combinations thereof.

The device 10 may be switched at least between ON and OFF states. The example shown in FIGS. 1D and 2, the oxygen-deficient portion OD of the metal oxide layer 26 of the switching region 24 generates oxygen vacancies or supplies metal ions to the conductive channel(s) of sub-oxide in the oxygen-rich portion O during ON-switching, while during OFF-switching, the oxygen vacancies (by oxygen ion being vertically driven into the conductive channels) or metal ions are vertically driven out of the conductive channel(s) into the oxygen-deficient portion 26, OD. During OFF switching and when transitioning to its associated high-resistance state, oxygen in the oxygen-rich portion O oxidizes the conductive channel(s) of sub-oxide.

Figure 3:
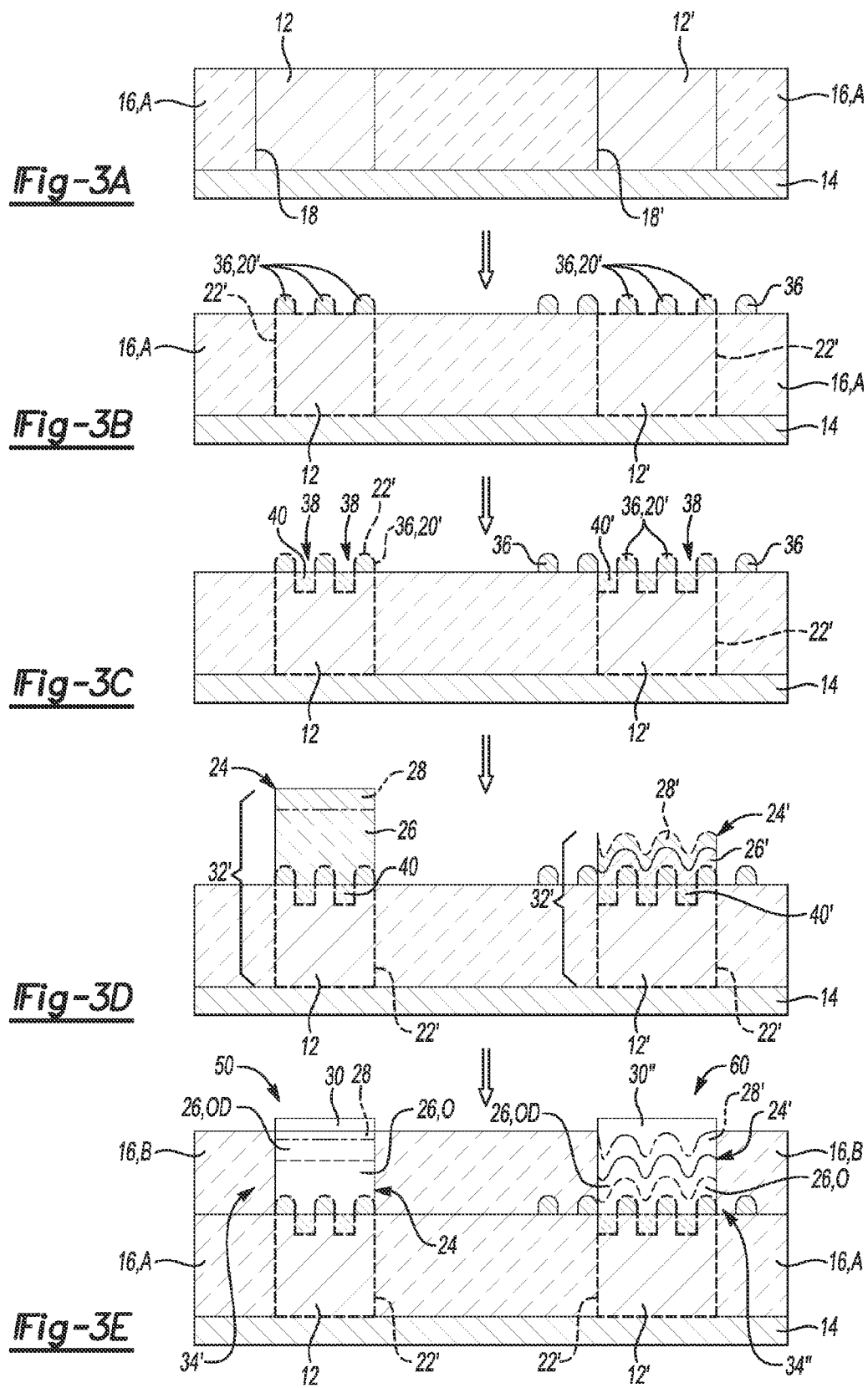
FIGS. 3A through 3E are cross-sectional views depicting another example of the method for making other examples of the resistive memory device.

Referring now to FIGS. 3A through 3E, another example of the method for making other examples of the resistive memory device/cell 50, 60 (see FIG. 3D) is schematically depicted. FIG. 3A is similar to FIG. 1A, except that multiple base electrodes 12, 12' are formed on the conductor 14 and only a portion A of the interlayer dielectric 16 is formed. The method shown in FIGS. 3A through 3E could be used to form a single two-terminal device as well.

It is to be understood that any of the materials and methods for forming the conductor 14, the interlayer dielectric 16, and the base electrode 12 described in reference to FIGS. 1A through 1D may be used to form the conductor 14, the portion A of the interlayer dielectric 16, and the base electrodes 12, 12' in this example. When multiple base electrodes 12, 12' are formed, the trenches 18, 18' formed in the portion A should be separated from one other by the remaining interlayer dielectric 16, A, so that the base electrodes 12, 12' formed in the respective trenches 18, 18' are also separated from one another in the same manner. This contributes to the resulting device 50, 60 being individually addressable and electrically isolated from one another when respective conductors 30, 30''' are formed (shown in FIGS. 3E and 4).

After the base electrodes 12, 12' are formed, this example of the method includes forming discontinuous nano-islands 36 at least in contact with the exposed surface of the base electrode 12, 12'. Two examples of discontinuous nano-islands 36 that may be formed are shown in FIG. 3B. As will be described below, the discontinuous nano-islands 36 may be selectively formed on the exposed surface of the base electrode 12 alone. As will also be described below, the discontinuous nano-islands 36 may be formed on the exposed surface of the base electrode 12' and on the surface of the portion A of the inter layer dielectric 16.

To form the discontinuous nano-islands 36 on the exposed surface of the base electrode 12 (without forming any on the surface of the interlayer dielectric 16), a selective formation process may be used. Selective formation is shown on the left-hand side of FIG. 3B. One example of the selective formation process is galvanic displacement. In galvanic displacement, nano-particles of the inert material are selectively deposited on the base electrode 12 from a solution containing the nano-particles. During galvanic displacement, the nano-particles form discrete, discontinuous islands 36 of the inert material on the exposed surface of the base electrode 12. Other examples of the selective formation process include atomic layer deposition (ALD). During ALD, platinum nano-particles preferentially grow on the base electrode 12 as opposed to the interlayer dielectric 16, depending in part, on the material of the base electrode 12.

To form the discontinuous nano-islands 36 on the exposed surface of the base electrode 12' and on the surface of the portion A of the interlayer dielectric, a non-selective formation process may be used. In an example, the non-selective formation process includes deposition of the inert material followed by annealing. As an example, the inert material may be deposited on the surface of the base electrode 12' and surface of the interlayer dielectric 16 surrounding the base electrode 12'. Examples of suitable deposition processes include sputtering, electron beam deposition, etc. The deposited inert material may then be exposed to annealing. The temperature of the annealing process may depend, in part, upon the inert material used. When platinum is used as the inert material, annealing may be performed at a temperature ranging from about 550° C. to about 600° C. for about 30 minutes, and when gold is used as the inert material, annealing may be performed at a temperature ranging from about 450° C. to about 480° C. for about 30 minutes. Annealing may be performed in air, or under vacuum, or in the presence of $N_2$ alone or combination with $H_2$, or Ar alone or combination with $H_2$.

It is to be understood, however, that the high temperature that may be used for proper annealing can significantly reduce the formation of nano-islands (i.e., a continuous layer of the inert metal may form instead). As such, rather than performing annealing, the base electrode 12' and the interlayer dielectric 16 may be heated during the deposition process. It has been found that by heating the base electrode 12' and interlayer dielectric 16 during deposition, platinum nano-islands may be formed at temperatures of 350° or lower, and that gold nano-islands may be formed at temperatures of 300° or lower.

The deposition and annealing process or heated deposition process may be preceded by pre-treatment of the base electrode 12'. In an example, the base electrode 12' may be exposed to a surface treatment process involving exposure to plasma for a predetermined time. The plasma may be $H_2$ plasma or $H_2$/Ar plasma or pure Ar plasma, and the predetermined time may depend, in part, upon the base electrode 12' that is used. In an example, the base electrode 12' is TiN, the plasma is $H_2$ plasma, and the predetermined time is about 10 minutes. When used, this pre-treatment process is followed by inert material deposition and annealing as previously described.

The discontinuous nano-islands 36 may be formed of any material that is suitable for making the inert material electrode 20 (e.g., Pt, Au, Ir, Ru, metal carbide, metal boride, etc.). The discontinuous nano-islands 36 that are in direct contact with the base electrode 12, 12' (and thus are indirectly in electrical contact with the conductor 14) form the inert material electrode 20' of the multi-component electrode 22', and make up part of the current path of the resulting device/cell 50, 60. Any discontinuous nano-islands 36 that are in contact with the portion A of the interlayer dielectric 16 and are not in contact with the base electrode 12, 12' do not form the inert material electrode 20'. Because these nano-islands 36 are not in contact with the base electrode 12, 12' and are discontinuous, they do not need to be removed from the device 60, at least in part because they are physically and electrically isolated from other nano-islands (e.g., 36 or 36, 20') and do not form part of the current path.

In an example, each of the discontinuous nano-islands 36, and 36, 20' has an aspect ratio (height:width) ranging from about 1:5 to about 1:1. In another example, the aspect ratio (height:width) ranges from about 1:3 to about 1:1. In a specific example, the aspect ratio (height:width) of each of the discontinuous nano-islands 36, and 36, 20' is about 1:1. The nano-island dimensions are on the nano-scale, and generally range from about 1 nm to about 100 nm.

As shown in FIG. 3B, the multi-component electrode(s) 22' is/are made up of the base electrode 12, 12' and the inert material electrode 20' (i.e., discontinuous nano-islands 36 on the base electrode 12, 12').

In this example of the method, the multi-component electrode 22' is exposed to an oxidation process so that any exposed surfaces 38 of the base electrode 12, 12' become oxidized. The oxidation process may be controlled so that the exposed surfaces 38 oxidize but so that oxidation does not occur through the entire thickness or depth of the base electrode 12, 12'. The inert material electrode 20' acts as a mask during oxidation. As such, the surfaces 38 of the base electrode 12, 12 between the inert material electrode 20' oxidize and become more insulating, while the inert material electrode 20' and the portion(s) of the base electrode 12, 12' masked by the inert material electrode 20' remain conductive. The oxidized portions of the base electrodes 12, 12' are shown at reference numerals 40, 40', respectively in FIG. 3C.

In an example, oxidation of the exposed surface 38 of the base electrode 12, 12' may be accomplished by exposing the surface 38 to furnace oxidation with a stream of oxygen gas or plasma oxidation at room temperature (about 18° C.) or higher for a predetermined time.

After oxidation of the surface 38, the shape of the multi-component electrode(s) 22' may change slightly. Since the oxidized portions 40, 40' of the base electrodes 12, 12' are less conductive than the remaining conductive portions of the base electrode 12, 12', they may not be considered part of the multi-component electrode 22. These oxidized portions 40, 40' exhibit a higher resistance to current flow to/from the conduction channel(s) of the switching region 24 or 24'.

In another example, the oxidation process previously described may not be performed because the deposition of the switching region 24 or 24' can serve as the oxidation step.

As shown in FIG. 3D, the switching region 24 or 24' is then formed on the inert material electrode 20' and the oxidized portions 40, 40'.

It is to be understood that any of the materials and methods for forming the metal oxide layer 26 and the metal layer 28 described in reference to FIGS. 1A through 1D may be used to form the metal oxide layers 26, 26' and, when desirable, the metal layers 28, 28' in this example. Similar to FIG. 1C, the oxygen-rich portion O and the oxygen-deficient portion OD of the switching regions 24, are not shown in FIG. 3D, in part because they may not be present after the initial formation of the metal oxide layers 26, 26'. Rather, the oxygen-rich portion O and the oxygen-deficient portion OD may be introduced into the switching regions 24, 24' after the devices 50, 60 are formed. The formation of the oxygen-rich portion O and the oxygen-deficient portion OD will be discussed further below in reference to FIG. 3E.

To initially form the switching region 24 (shown on the left hand side of FIG. 3D), the metal oxide may be deposited on the inert material electrode 20 and the oxidized portions 40 to form a planar metal oxide layer 26. Deposition may be accomplished as previously described, and may be performed until the planar configuration is achieved. Alternatively, the metal oxide may be deposited and planarized or etched back to achieve the planar configuration. In this example, the inert material electrode 36, 20' may be considered to extend into the switching region 24.

To initially form the switching region 24' (shown on the right hand side of FIG. 3D) on the inert material electrode 20' and the oxidized portions 40, the metal oxide may be deposited to form a layer 26' that is conformal with respect to the underlying inert material electrode 20'. Deposition may be accomplished using any conformal coating process, such as sputtering, ALD, CVD, etc. In this example, the inert material electrode 20' may be described as being covered by the switching region 24'.

As shown in FIG. 3D, formation of the switching region 24, 24' may also involve forming the metal layer 28, 28' on the metal oxide layer 26, 26'. The material used to form the metal layer 28, 28' respectively depends upon the metal oxide layer 26, 26' that is used. Any suitable metal deposition technique may be used, and the resulting metal layer 28 may be planar or may conform to the geometry of the underlying components (metal layer 28'). The metal layer 28, 28' may be deposited and planarized or etched back to achieve a planar configuration.

In another example, the metal oxide layer 26, 26' and the metal layer 28, 28' may be deposited and then patterned together.

Together, the multi-component electrode 22' and the switching region 24, 24' form examples of the resistive memory stack 32'.

The example method shown in FIGS. 3A through 3D may also be performed without pre-patterning the interlayer dielectric 16 and the base electrodes 12, 12'. Rather, the entire resistive stack 32' could be formed on the conductor 14 (e.g., by blanket depositing each of the layers) and then patterning the layers together in a single etching step. In this example, the interlayer dielectric 16 may or may not be deposited after etching so that it surrounds each of the stacks 32'.

In the example shown in FIGS. 3A through 3E, after the resistive memory stack 32' is formed, the method further includes forming the other portion B of the interlayer dielectric 16, and forming the second conductors 30, 30' on the switching regions 24, 24' of the stacks 32'. Both the portion B, 16 and the second conductors 30, 30" are depicted in FIG. 3E.

The portion B may be the same material as the portion A, and may be deposited using any of the techniques previously described for the interlayer dielectric 16. In an example, the interlayer dielectric 16 is deposited (e.g., by spin coating, bar coating etc.) to cover the portion A and the resistive memory stack 32'. The portion B may then be planarized using conventional chemical mechanical planarization (CMP) or an etching process. Removal of the portion B may take place until the top surface of the resistive memory stack 32' is exposed (i.e., so that the outermost layer of the switching region 24, 24' is exposed).

The conductors 30, 30' may be formed such that they are in respective electrical contact with the switching region(s) 24, 24'. In the example of FIG. 3E, the conductor 30 is in contact with the switching region 24, and the conductor 30" is in contact with the switching region 24'. Since multiple switching regions 24, 24' are formed on the single conductor 14, it is to be understood that conductors 30, 30" are formed to be in electrical contact with a single one of the switching regions 24, 24' and to be electrically isolated from one another.

Furthermore, the respective material stacks may support the conductors 30, 30'. The conductors 30, 30" may also be formed of any of the materials and by any of the techniques previously discussed for the conductor 14.

It is to be understood that when the metal layer 28, 28' is not included in the switching region 24, 24', the conductor 30, 30' will be in direct contact, respectively, with the metal oxide layer 26, 26'. It is to be further understood that when the metal layer 28, 28' is included, the conductor 30, 30" will be in direct contact, respectively, with the metal layer 28, 28'.

With the addition of conductors 30, 30", the resistive memory devices 50, 60 are formed. Each device 50, 60 has a single junction 34', 34" (with one resistive memory stack 32') located between the conductors 14, 30 and 14, 30". Each junction 34, 34' is individually addressable by the respective conductors 14, 30 and 14, 30". It is to be understood that the conductors 14, 30 may be formed in a crossbar configuration or in a non-crossbar configuration (e.g., for integration with a single transistor).

When the devices/cells 50, 60 are first fabricated, the entire switching regions 24, 24' may either be nonconductive or n an initial high resistive state. As such, a forming process or an initial switching process may be utilized to form at least some conductive channel(s) in the metal oxide layers 26, 26' between at least the inert material electrode 20' of the multi-component electrode 22' and the respective conductor 30, 30". The conductive channel(s) within the metal oxide layers 26, 26' form part of a current path between the conductors 14, 30 and 14, 30". The remainder of the current path is made up of the multi-component electrode 22', where the conduction path is preferentially through the inert material electrode 20'.

When the device/cell is initially conductive, the forming process may be accomplished using electroforming or thermal annealing as previously described. In other examples, the device/cell 50, 60 is a forming-free device/cell 50, 60.

The devices/cells 50, 60 may be independently switched at least between ON and OFF states. In the example shown in FIG. 3E, the oxygen-deficient portion OD of the metal oxide layer 26, 26' of the switching region 24, 24' creates oxygen vacancies or supplies metal ions to the conductive channel(s) of sub-oxide in the oxygen-rich portion 26, O and 26', O during ON-switching, while during OFF-switching, the oxygen vacancies are depleted (by oxygen on being vertically driven into the conductive channels) or metal ions are vertically driven out of the conductive channel(s) into the oxygen-deficient portion 26, OD and 26', OD. During OFF switching and when transitioning to its associated high-resistance state, oxygen in the oxygen-rich portion 26, O and 26', O oxidizes the conductive channel(s) of sub-oxide.

Figure 4:
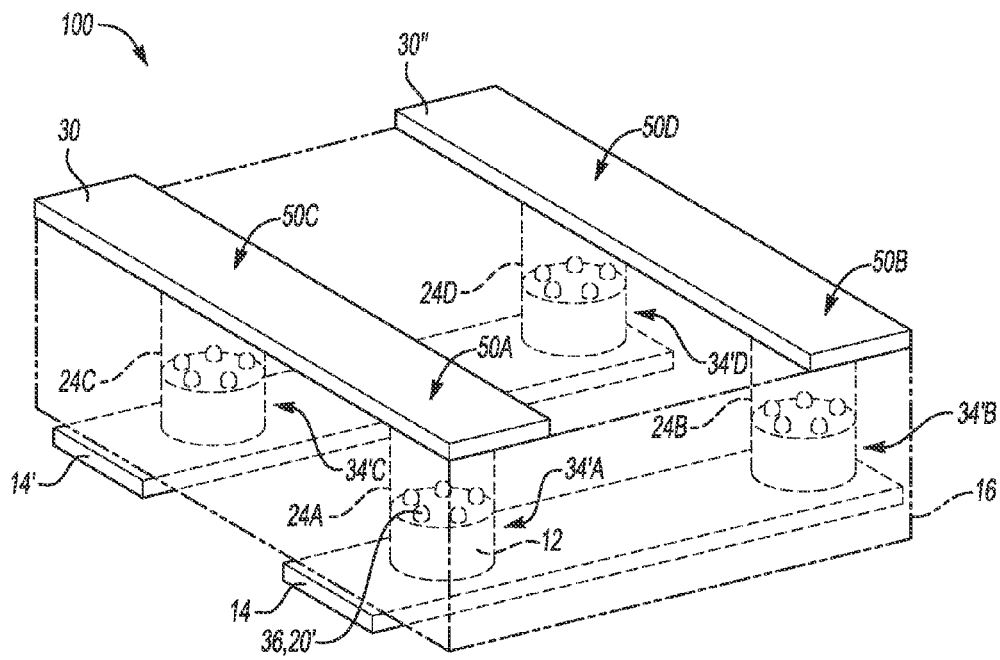
FIG. 4 is a perspective view of an example of an array including a plurality of an example of the resistive memory device formed from the method shown in FIGS. 3A through 3E.

Any of the devices 10, 50, 60 may be included in a crossbar array 100, as shown in FIG. 4. In this example, the crossbar array 100 includes four of the devices 50, namely 50A, 50B, 50C, 50D. Generally, the crossbar array 100 is an array of switches wherein the conductors 14, 14' in a set of parallel bottom conductors cross the conductors 30, 30" in a set of parallel top conductors at non-zero angles. In many instances, the two sets of conductors 14, 14' and 30, 30" are perpendicular to each other. However, this is not a necessary condition, and the two sets of conductors 14, 14' and 30, 30" may be offset at any non-zero angle.

In the crossbar array 100, a device 50A, 50B, 50C, 50D is formed at the intersection of any two conductors 14, 14' and 30, 30", Each device 50A, 50B, 50C, 50D includes a respective junction 34'A, 34'B, 34'C, 34'D including a respective switching region 24A, 24B, 24C, 24D. It is to be understood that the various layers 26 (including portions OD and O) and 28 are not shown for clarity. The switching region 24A, 24B, 24C, 24D at each junction 34'A, 34'B, 34'C, 34'D is individually addressable after initial fabrication (including, in some examples, electroforming or thermal annealing) by virtue of the respective conductors 14, 14' and 30, 30" being in electrical contact with the switching region 24A, 24B, 24C, 24D. For example, if conductors 14' and 30" are addressed with an appropriate voltage and polarity, device 50D is activated and switched to either the ON state or the OFF state, and if conductors 14 and 30 are addressed with an appropriate voltage and polarity, device 50A is activated and switched to either the ON state or the OFF state. In the crossbar array 100, it is to be understood that when one or more individual devices 50A, 50B, 50C, 50D is/are addressed, the switching region 24A, 24B, 24C, 24D positioned outside of the junction 34'A, 34'B, 34'C, 34'D that is being addressed may be under some bias that is insufficient to render a transition in the resistance state of that switching region 24A, 24B, 24C, 24D outside of junction 34'A, 34'B, 34'C, 34'D.

Figure 5:
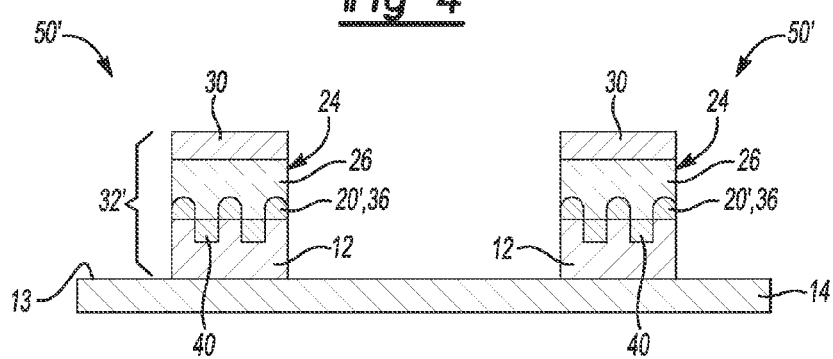
FIG. 5 is a cross-sectional view of another example of the resistive memory device.

Referring now to FIG. 5, still another example of the device/cell 50 is depicted. In this example, two devices 50 are formed on a single conductor 14. The devices 50' are similar to the device 50, except that an interlayer dielectric 16 does not surround the respective devices 50.

In this example, the base electrode 12 is not formed in a trench 18 of the interlayer dielectric 16. Rather, the base electrode 12 is formed with a pillar-like geometry that protrudes outward from the contact surface 13 of the conductor 14 without any surrounding material. The pillar-like geometry may be a cylinder, rectangular prism, a cube, or another suitable geometric shape. The base electrode 12 may be formed of any of the materials previously described. In this example, the base electrode 12 may be fabricated using any suitable technique, such as photolithography, electron beam lithography, imprint lithography, thermal or e-beam evaporation, sputtering, atomic layer deposition (ALD), or the like.

The various other layers of the stack 32' may be formed as previously described in reference to FIGS. 3B through 3E. It is to be understood that in this example, the portion B will not be formed, and the conductors 30, 30" will be supported by the multi-component electrode 22' (e.g., including 12 and 20') and the switching region 24.

Figure 6:
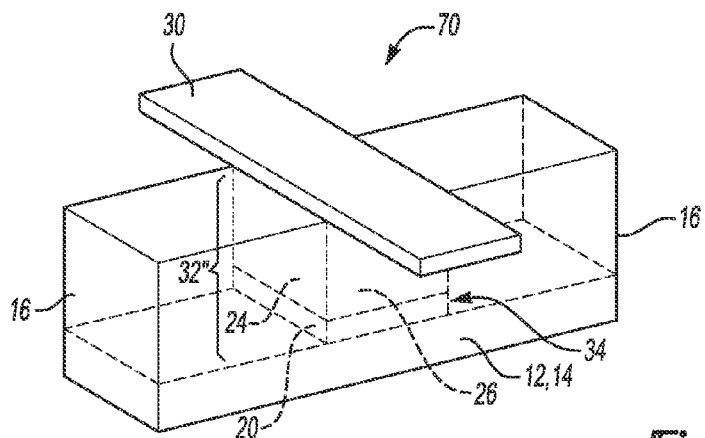
FIG. 6 is a perspective view of yet another example of the resistive memory device.

FIG. 6 depicts still another example of the resistive memory device 70. The device 70 shown in FIG. 6 is similar to device 10 shown in FIG. 2, except that the base electrode 12 functions as the conductor 14, and thus conductor 14 is not present. In this example, the base electrode 12 may be formed via any of the techniques previously described for the conductor 14.

In this example, the inert material electrode 20 and the switching region layer(s) 26 or 26 and 28 may be deposited as layers on the surface of the base electrode 12 and then may be etched, milled, lifted off, or otherwise removed to form the stack 32". This example, the stack 32" includes the inert material electrode 20 and the switching region 24. As such, the formation of the stack 32" may be accomplished using one lithography step. Alternatively, the inert material electrode 20 and the switching region layers 26 or 26 and 28 may be selectively deposited so that removal in undesirable areas is not necessary, and the stack 32" is formed in a desirable position by virtue of the selective deposition. In these examples, the interlayer dielectric 16 may then be formed on exposed portions of the surface of the base electrode 12, 14. The interlayer dielectric 16 may be formed by any of the techniques previously described herein (e.g., deposited and etched back to be planar with the switching region 24).

The device 70 shown in FIG. 6 may also be formed by first depositing the interlayer dielectric 16 as a layer on the base electrode 12, 14. A via hole (similar to trench 18 but not shown in FIG. 6) may be formed through the interlayer dielectric 16 to expose a surface of the base electrode 12, 14 where the stack 32' is to be formed. The inert material electrode 20 and the switching region layers 26 or 26 and 28 may be selectively deposited in the via hole. If the resulting stack 32" is not planar with the interlayer dielectric, 16, the interlayer dielectric 16 may be etched back.

Regardless of the technique used to form the stack 32", the conduct 30 may then be formed and positioned in a crossbar (shown in FIG. 6) or non-crossbar configuration. The device 70 may be exposed to electroforming or thermal annealing as previously described if it is not initially conductive.

It is to be understood that device 70 may or may not include interlayer dielectric 16. As shown in FIG. 6, when included, the interlayer dielectric 16 may be adjacent to a perimeter of the stack 32", and the top of the stack 32" may contact the conductor 30. In other instances (e.g., when a substrate is used), the interlayer dielectric 16 may surround a perimeter of the entire stack 32", and if desirable, the exposed sides of the base electrode 12, 14.

Figure 7:
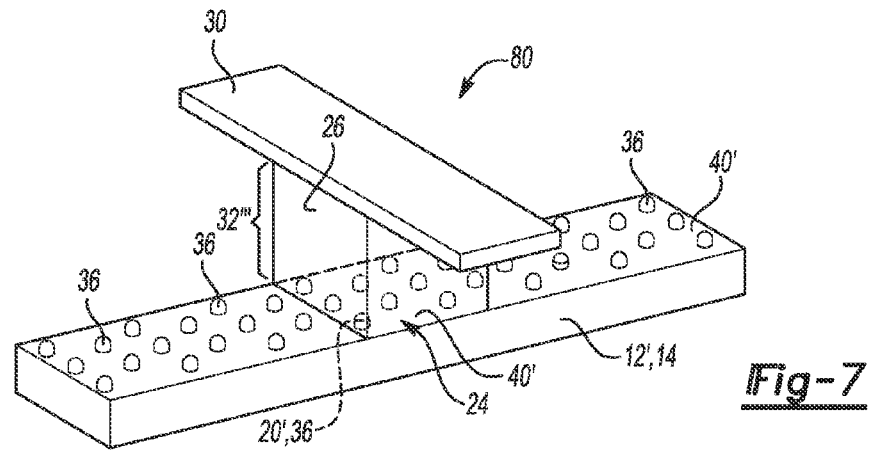
FIG. 7 is a perspective view of still another example of the resistive memory device.

FIG. 7 depicts yet another example of the resistive memory device 80. The device 80 shown in FIG. 7 is similar to device 60 shown in FIG. 3E, except that e base electrode 12' functions as the conductor 14 (and thus conductor 14 is not present), the interlayer dielectric 16 is not used, and the switching region 24 (instead of 24') is included. In this example, the base electrode 12' may be formed via any of the techniques previously described for the conductor 14.

It is to be understood that the nano-islands 36 may be formed by any of the selective or non-selective deposition processes described herein, and will deposit across the exposed surface of the electrode 12'. In this example, the entire surface of the base electrode 12' may be exposed to an oxidation process as previously described herein. All of the nano-islands 36 act as a mask during oxidation (which may take place during formation of the switching region 24). As such, the exposed surfaces of the base electrode 12' between the nano-islands 36 oxidize and become more insulating, while the nano-islands 36 and the portion(s) of the base electrode 12 masked by the nano-islands 36 remain conductive. The oxidized portions of the base electrode 12' are shown at reference numeral 40'. The extent to which the depth of oxidation extends into the base electrode 12' depends, in part, on how long the process is performed.

In this example, the switching region layers 26 or 26 and 28 may be selectively deposited at a desired area on the base electrode 12', and so that the layer(s) 26 or 26 and 28 cover those nano-islands 36 that will function as the inert material electrode 20'. Selective deposition of the layer(s) 26 or 26 and 28 forms the stack 32''', which includes the inert material electrode 20' and the switching region 24. Alternatively, the switching region layer(s) 26 or 26 and 28 may be deposited as layers on the oxidized portion 40' of the base electrode 12' and over all of the nano-islands 36. The layer(s) 26 or 26 and 28 may then be etched, milled, lifted off, or otherwise removed to form the stack 32'''. This process may also remove the nano-islands 6 that are postponed outside of the area where the stack 32''' is to be formed.

The conductor 30 may then be formed and positioned to cross the base electrode 12', 14 at any non-zero angle. The device 80 (if initially nonconductive) may be exposed to electroforming or thermal annealing as previously described.

While not shown in FIG. 7, it is to be understood that the interlayer dielectric 16 may be formed on the remaining exposed oxidized portion 40' and over any nano-islands 36 that are not part of the stack 32''' prior to forming the conductor 30. The interlayer dielectric 16 may be formed by any of the techniques previously described herein (e.g., deposited and etched back to be planar with the switching region 24). When included, the interlayer dielectric 16 may be adjacent to some of the stack 32'''. In other instances (e.g., when a substrate is used), the interlayer dielectric 16 may surround a perimeter of the entire stack 32''', and, if desirable, the exposed sides of the base electrode 12', 14.

In this example device 80, any discontinuous nano-islands 36 that are in contact with the base electrode 12' and are not in contact with the switching region 24 do not form the inert material electrode 20'. Because these nano-islands 36 are not in contact with the switching region 24 and are discontinuous, they do not need to be removed from the device 80, at least in part because they are physically and electrically isolated from other nano-islands (e.g., 36 or 36, 20') and do not form part of the current path.

Figure 8:
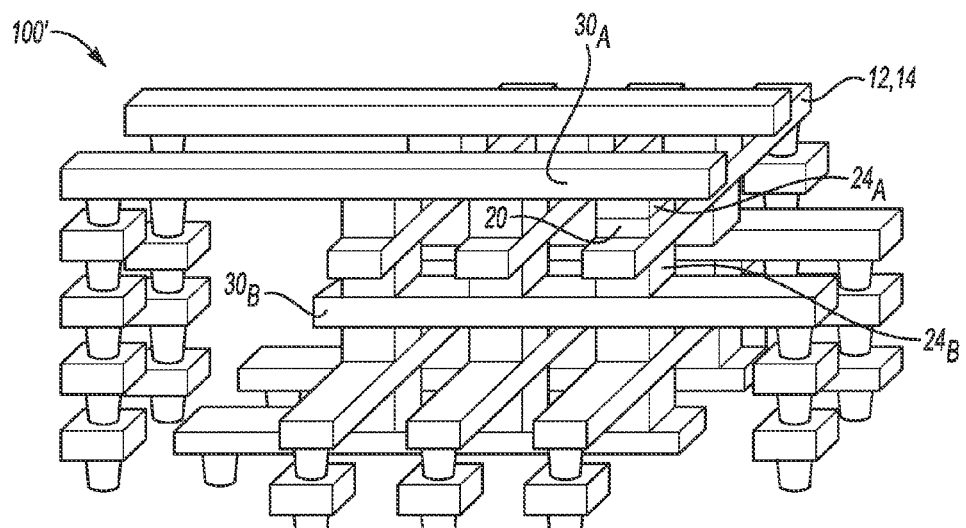
FIG. 8 is a perspective view of the resistive memory device integrated into a stacked crossbar array.

FIG. 8 illustrates yet another crossbar array 100'. This array 100' is a stacked including a device/cell at the intersection of each pair of crossing conductors e.g., at $30_A$ and 12, 14, at 12, 14 and $30_B$, etc. At each intersection are an inert material electrode 20 (part of the multi-component electrode 22, not labeled here) and the switching region $24_A$, $24_B$. As an example, the conductors $30_A$, $30_B$ may be bit lines and the conductors 12, 14 may be word lines, and each device/cell may be selectively addressed as previously described.

Figure 9:
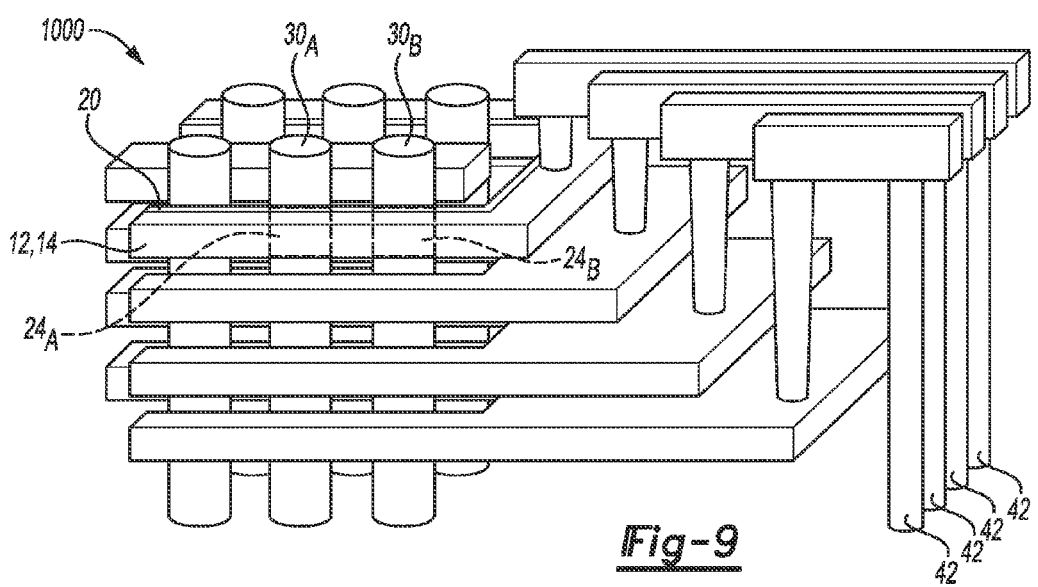
FIG. 9 is a perspective view of the resistive memory device integrated into an array with a vertical configuration.

FIG. 9 illustrates a vertical or 3D configuration 1000 including multiple devices/cells. This configuration is similar to a 3D NAND flash memory and may be desirable for a ReRAM/memristor. In this example, some of the conductors $30_A$, $30_B$ are vertically oriented (e.g., with respect to a substrate plane upon which the 3D configuration 1000 may be formed), and the other conductors 12, 14 are horizontally oriented (e.g., also with respect to a substrate plane upon which the 3D configuration 1000 may be formed). In this example, the conductors 12, 14 and the inert material electrode 20 make up the multi-component electrode 22 (not labeled). It is to be understood that the nano-islands 36 may also be used in this 3D configuration 1000 as the inert material electrode 20 in place of the thin film inert material electrode 20.

In FIG. 9, the switching region $24_A$, $24_B$ is located at the intersection of each vertical conductor $30_A$, $30_B$ and each horizontal conductor 12, 14.

The layers and components of the vertical or 3D configuration 1000 may be formed using many of the techniques disclosed herein, such as electroplating and electroless plating (with or without annealing). Still other suitable fabrication methods may include lithography and deposition techniques.

In any of the examples disclosed herein, electrical connectors may contact the conductors in order to electrically address the conductors in a particular manner. In FIG. 9, jumpers 42 are connected to each of the horizontal conductors 12, 14 and the electrical connectors for the vertical conductors $30_A$, $30_B$ are not shown.

While not shown in the examples disclosed herein, it is to be understood that the devices 10, 50, 50', 60, 70, 80 (whether in the form of a single device/cell or an array 100, 100', or configuration 1000) may be supported on an insulating layer. The insulating layer may be used alone, or in combination with another substrate. An example of a suitable insulating layer is silicon dioxide ($SiO_2$) and an example of a suitable substrate is a silicon (Si) wafer. As an example, the devices 10, 50, 50', 60, 70, 80 may be fabricated directly on the insulating layer supported by the substrate. For example, the conductor 14 or base electrode 12 may be formed and patterned on the insulating layer, and then the other device components may be fabricated thereon in accordance with any of the methods described herein.

Also while not shown in the examples disclosed herein, it is to be understood that the conductor 30 or 30' may be replaced with a multi-component electrode 22, 22', as long as the inert material electrode 20 or the inert material electrode 20' and the oxidized portion 40, 40' are in contact with the switching region 24, 24'. In this example, the base electrode 12 would function as the conductor 30 or 30', and would be in electrical contact with the switching region 24, 24' through at least the inert material electrode 20, 20'. Furthermore, when multiple conductors 14, 30 are included, a multi-component electrode 22, 22' (i.e., base electrode 12 and inert material electrode 20 or 20') may be formed in contact with each of the conductors 14, 30 or 30'. For example, the device 10 shown in FIG. 2 may include a second multi-component electrode between the switching region 24 and the conductor 30, as long as the inert material electrode 20 is in contact with the switching region 24 and the base electrode 12 is in contact with the conductor 30.

It is to be understood that the components of the examples disclosed herein may be positioned in a number of different orientations, and any directional terminology used in relation to the orientation of the components is used for purposes of illustration and is in no way limiting, unless specified otherwise. Directional terminology includes words such as "top," "bottom," "horizontal," "vertical," etc. As an example, any of the devices may be oriented with the conductor 30 as the bottom conductor, and the conductor 14 or 14, 12 as the top conductor.

Reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

It is to be understood that the ranges provided herein include the stated range and any value or sub-range within the stated range. For example, a range of 5 nm or less should be interpreted to include not only the explicitly recited limits of 5 nm or less, but also to include individual values, such as 3 nm, 4.25 nm, 0.5 nm, etc., and sub-ranges, such as from about 1 nm to about 4.8 nm, from about 2 nm to about 4 nm, etc. Furthermore, when "about" or "substantially" is utilized to describe value, this is meant to encompass minor variations (up to +/−10%) from the stated value. In the case of the discontinuous nano-islands 36 however, it is to be understood that minor variations in width or diameter of the nano-islands may not be included if the variations would result in elimination of the discontinuity.

In describing and claiming the examples disclosed herein, the singular forms "a", "an" and "the" include plural referents unless the context clearly dictates otherwise.

While several examples have been described in detail, it will be apparent to those skilled in the art that the disclosed examples may be modified. Therefore, the foregoing description is to be considered non-limiting.

What is claimed is:

1. A resistive memory device, comprising:
   a conductor; and
   a resistive memory stack positioned in contact with the conductor, the resistive memory stack including:
      a multi-component electrode including:
         a base electrode having a surface and an oxidized portion; and
         an inert material electrode on the base electrode surface in a form of i) a thin layer, or ii) discontinuous nano-islands; and one of
            i) a switching region in contact with the conductor and with the inert material electrode when the inert material electrode is in the form of the thin layer; or
            ii) a switching region in contact with the conductor, with the inert material electrode, and with the oxidized portion of the base electrode when the inert material electrode is in the form of the discontinuous nano-islands.

2. The resistive memory device as defined in claim 1 wherein the inert material electrode is in the form of the discontinuous nano-islands, and wherein the oxidized portion of the base electrode includes the surface of the base electrode between the discontinuous nano-islands.

3. The resistive memory device as defined in claim 2 wherein each of the discontinuous nano-islands has an aspect ratio (height:width) ranging from about 1:5 to about 1:1.

4. The resistive memory device as defined in claim 1 wherein the inert material electrode is in the form of the thin layer, and wherein a thickness of the thin layer is 10 nm or less.

5. The resistive memory device as defined in claim 1 wherein:
   the base electrode is selected from the group consisting of titanium nitride, tantalum nitride, tungsten, aluminum, copper, and combinations thereof; and
   the inert material electrode is electrically conductive and inert to oxidation and is selected from the group consisting of platinum, gold, iridium, ruthenium, metal carbide, metal boride, and combinations thereof.

6. The resistive memory device as defined in claim 1 wherein:
   the conductor is an other multi-component electrode including:
      a second base electrode having a second surface; and
      a second inert material electrode on the second base electrode surface in a second form of i) a second thin layer, or ii) a second set of discontinuous nano-islands; and one of
         i) the switching region is in contact with the second inert material electrode when the second inert material electrode is in the form of the second thin layer; or
         ii) the switching region is in contact with the second inert material electrode and with a second oxidized portion of the second base electrode when the second inert material electrode is in the form of the second set of discontinuous nano-islands.

7. The resistive memory device as defined in claim 1 wherein the switching region includes:
   a metal oxide layer having an oxygen-rich portion and an oxygen-deficient portion; and
   a metal layer in contact with the oxygen-deficient portion and with the conductor.

8. The resistive memory device as defined in claim 1, further comprising a second conductor crossing the conductor at a non-zero angle, wherein the base electrode of the multi-component electrode is positioned on the second conductor.

9. The resistive memory device as defined in claim 1, further comprising an interlayer dielectric surrounding at least the switching region.

10. The resistive memory device as defined in claim 1 wherein the resistive memory device has a crossbar configuration or a non-crossbar configuration.

11. A resistive memory device, comprising:
    a first conductor;
    a second conductor;
    a resistive memory stack positioned between the first and second conductors, the resistive memory stack including:
       a multi-component electrode on the first conductor, the multi-component electrode including:
          a base electrode having a surface; and
          an inert material electrode on the base electrode surface in a form of discontinuous nano-islands; wherein the base electrode surface between the discontinuous nano-islands is an oxidized portion of the base electrode; and
    a switching region in contact with the second conductor, with the inert material electrode, and with the oxidized portion of the base electrode, the switching region including:
       a metal oxide layer having an oxygen-rich portion and an oxygen-deficient portion; and
       a metal layer in contact with the oxygen-deficient portion.

12. A method for making a resistive memory device, the method comprising:
    forming a multi-component electrode by:
       forming a base electrode having an oxidized portion; and
       forming an inert material electrode on a surface of the base electrode in a form of i) a thin layer, or ii) discontinuous nano-islands;
    forming a switching region on the multi-component electrode such that a surface of the switching region is in i) contact with the inert material electrode when the inert material electrode is in the form of the thin layer, or ii) contact with the inert material electrode and with the oxidized portion of the base electrode when the inert material electrode is in the form of the discontinuous nano-islands; and
    forming a conductor in electrical contact with another surface of the switching region.

13. The method as defined in claim 12 wherein the inert material electrode is in the form of the thin layer and is formed by electroplating from a solution.

14. The method as defined in claim 12 wherein the inert material electrode is in the form of the discontinuous nano-islands, and wherein prior to forming the switching region, the method further comprises forming the oxidized portion by oxidizing the surface of the base electrode between the discontinuous nano-islands using the discontinuous nano-islands as a mask.

15. The method as defined in claim 14 wherein forming the inert material electrode is accomplished by one of:
   galvanic displacement of inert material nano-particles from a solution; or
   non-selective deposition of an inert metal on the surface of the base electrode.

* * * * *